United States Patent [19]
Takahashi et al.

[11] Patent Number: 5,885,723
[45] Date of Patent: Mar. 23, 1999

[54] BONDING FILM FOR PRINTED CIRCUIT BOARDS

[75] Inventors: Atsushi Takahashi; Shinji Ogi, both of Yuki; Koji Morita, Shimodate; Kazunori Yamamoto, Tsukuba; Ken Nanaumi, Shimodate; Kiyoshi Hirosawa, Ibaraki-ken; Akinari Kida, Tochigi-ken; Takao Hirayama, Ibaraki-ken; Toshihiko Ito, Ibaraki-ken; Hiroaki Hirakura, Ibaraki-ken, all of Japan

[73] Assignee: Hitachi Chemical Company, Ltd., Tokyo, Japan

[21] Appl. No.: 994,965

[22] Filed: Dec. 19, 1997

[30] Foreign Application Priority Data

Dec. 25, 1996 [JP] Japan .................... 8-345329
Dec. 25, 1996 [JP] Japan .................... 8-345330
Dec. 25, 1996 [JP] Japan .................... 8-345331
Dec. 25, 1996 [JP] Japan .................... 8-345332

[51] Int. Cl.$^6$ .................... B32B 15/08; C08F 283/04
[52] U.S. Cl. .................... 428/626; 528/86; 525/423; 525/430; 525/432; 525/534; 525/540; 522/134; 428/221; 428/357; 428/423.1; 428/474.4; 428/901
[58] Field of Search .................... 528/86; 525/423, 525/430, 432, 534, 540; 522/134; 428/221, 357, 474.4, 423.1, 901, 626

[56] References Cited

FOREIGN PATENT DOCUMENTS

| 1-170098 | 7/1989 | Japan . |
| 3-35284 | 2/1991 | Japan . |
| 4-119846 | 4/1992 | Japan . |
| 4-339852 | 11/1992 | Japan . |
| 5-93041 | 4/1993 | Japan . |

*Primary Examiner*—Samuel A. Acquah
*Attorney, Agent, or Firm*—Dickstein Shapiro Morin & Oshinsky LLP

[57] ABSTRACT

Provided is bonding film for printed circuit boards which is resistant to cracking even when bent with a small radius of curvature, has a sufficient mechanical strength even in its semi-cured state so that the handling may be facilitated, is not undesirably brittle and therefore does not produce undesired debris when cut, and is flexible and flame retardant at the same time. The bonding film may consist of (i) high polymer epoxy resin; (ii) denatured polyamide obtained by reacting epoxy resin and polyamide; (iii) polyfunctional epoxy resin; and (iv) curing agent. Preferably, the denatured polyamide includes a polyalkylene-glycol residue or a polycarbonate-diol residue. Preferably, the high polymer epoxy resin is produced by the polymerization of bifunctional epoxy resin and bifunctional phenol resin, and has a weight averaged molecular weight equal to 50,000 or higher.

12 Claims, No Drawings

BONDING FILM FOR PRINTED CIRCUIT BOARDS

TECHNICAL FIELD

The present invention generally relates to the technology of printed circuit boards, and in particular to bonding film for printed circuit boards.

BACKGROUND OF THE INVENTION

With the progress in the technology of multi-layer printed circuit boards for a higher level of integration and size reduction, the use of bonding film has come to be preferred over more conventional glass cloth and other base materials because of ease of handling. The bonding film typically consists of organic material such as polyimide resin and epoxy resin. In particular, materials essentially consisting of epoxy resin are preferred in view of heat resistance, molding temperature and cost. Japanese patent laid open publication (kokai) No. 4-119846 discloses epoxy resin film consisting of high polymer epoxy resin. Japanese patent laid open publication (kokai) No. 4-339852 discloses an epoxy resin composition which consists of high polymer epoxy resin, polyfunctional epoxy resin, and a curing agent, and is suitable for making epoxy bonding film. Japanese patent laid open publication (kokai) No. 5-93041 discloses flame retardant epoxy resin film.

By combining polyfunctional epoxy resin with high polymer epoxy resin, it is possible to obtain bonding film for printed circuit boards that demonstrates high heat resistance, favorable bonding property, and high resistance to chemical erosions. However, bonding film containing polyfunctional epoxy and a curing agent gives rise to crosslinking by heating, and is known to lose some of the flexibility once it is cured. Therefore, when such bonding film is used as a cover layer of a printed circuit board having a flexible section, cracks may be produced in parts of the bonding film when such a flexible section is bent due to small scratches and other damages that may be sustained during the process of washing, grinding, cutting, transportation, and mounting component parts. It is also known that the flexibility may be improved by adding rubber-like resin in the bonding film, however, at the expense of compromising the flame retardant property of the bonding film.

Also, due to the fact that polyfunctional epoxy resin having a relatively small molecular weight, the bonding film in its semi-cured state may be so brittle that debris in the form of powder tends to be produced when cutting the bonding film. The tendency of the bonding film to easily crack makes the handling of the bonding film difficult.

The Inventors of this patent application has studied these problem, and has discovered that the bonding film prepared according to the present invention can resolve such problems.

BRIEF SUMMARY OF THE INVENTION

In view of such problems of the prior art and the recognition by the inventors, a primary object of the present invention is to provide bonding film for printed circuit boards which is resistant to cracking even when bent with a small radius of curvature.

A second object of the present invention is to provide bonding film for printed circuit boards which has a sufficient mechanical strength even in its semi-cured state so that the handling may be facilitated.

A third object of the present invention is to provide bonding film for printed circuit boards which is not undesirably brittle and therefore does not produce undesired debris when cut.

A fourth object of the present invention is to provide bonding film for printed circuit boards which is flexible and flame retardant at the same time.

A fifth object of the present invention is to provide bonding film for printed circuit boards which has a favorable bonding property.

A sixth object of the present invention is to provide bonding film for printed circuit boards which has a favorable heat resistance, in particular resistance to soldering heat.

According to a first aspect of the present invention, such an object can be accomplished by providing bonding film for printed circuit boards, comprising: (i) high polymer epoxy resin; (ii) denatured polyamide obtained by reacting epoxy resin and polyamide; (iii) polyfunctional epoxy resin; and (iv) curing agent. Preferably, the denatured polyamide includes a polyalkylene-glycol residue or a polycarbonate-diol residue. In other words, the denatured polyamide has a polyalkylene-glycol skeleton or a polycarbonate-diol skeleton in its molecular structure. Preferably, the high polymer epoxy resin is produced by the polymerization of bifunctional epoxy resin and bifunctional phenol resin, and has a weight averaged molecular weight equal to 50,000 or higher.

According to a second aspect of the present invention, such objects can be accomplished by providing bonding film for printed circuit boards, comprising: (i) high polymer epoxy resin; (ii) polyamide resin having a polyalkylene-glycol residue; and (iii) polyfunctional epoxy resin. Preferably, the high polymer epoxy resin is produced by the polymerization of bifunctional epoxy resin and bifunctional phenol resin, and has a weight averaged molecular weight equal to 50,000 or higher. Preferably, the polyalkylene-glycol residue consists of a polytetramethylene-ether-glycol residue.

According to a third aspect of the present invention, such objects can be accomplished by providing bonding film for printed circuit boards, comprising: (i) high polymer epoxy resin; (ii) solvent soluble polyamide resin; and (iii) polyfunctional epoxy resin. Preferably, the polyamide resin is soluble in at least one of a member selected from amide solvents, ketone solvents and lactone solvents. Preferably, the polyamide resin comprises an aromatic residue.

According to a fourth aspect of the present invention, such objects can be accomplished by providing bonding film for printed circuit boards, comprising: (i) halogenated high polymer epoxy resin; (ii) halogenated epoxy resin denatured polyamide; (iii) polyfunctional epoxy resin; and (iv) curing agent. Preferably, the halogenated epoxy resin denatured polyamide includes a polyalkylene-glycol residue or a polycarbonate-diol residue. In other words, the halogenated epoxy resin denatured polyamide includes a polyalkylene-glycol skeleton or a polycarbonate-diol residue skeleton in its molecular structure. Preferably, the halogenated high polymer epoxy resin is produced by the polymerization of bifunctional epoxy resin and bifunctional phenol resin, and has a weight averaged molecular weight equal to 50,000 or higher.

DETAILED DESCRIPTION OF THE PREFERRED EMBODIMENTS

Now the present invention is described in the following in terms of concrete embodiments, but these embodiments are not intended to limit the present invention.

(A) Embodiments Using Denatured Polyamide

According to a first aspect of the present invention, the high polymer epoxy resin of the present invention is suited to be formed into film, and can be made by polymerizing bifunctional epoxy resin and bifunctional phenol resin in a polymerization reaction solvent in the presence of a catalyst and in a heated condition. The equivalent molecular ratio between bifunctional epoxy resin and bifunctional phenol resin is (epoxy group)/(phenol hydroxyl group)=1:0.9 to 1.1, and the polymerization reaction solvent may consist of an amide solvent or a ketone solvent having a boiling point of 100° C. or higher. The polymerization process is carried out in the presence of a catalyst and at the polymerization reaction temperature of 150° C. or lower.

The bifunctional epoxy resin may be freely selected from compounds having two epoxy groups, and may consist of bisphenol A type epoxy resin, bisphenol F type epoxy resin, bisphenol S type epoxy resin, alicyclic epoxy resin, aliphatic chain epoxy resin, diglycidyl etherified bifunctional phenols, diglycidyl etherified bifunctional bifunctional alcohols, halogenated compounds of these compounds, and hydrogen added compounds of these substances. The molecular weights of these compounds may be freely selected, and they may also be used in combination.

The bifunctional phenol resin may be freely selected from compounds having two phenol hydroxyl groups, and may consist of monocyclic bifunctional phenols such as hydroquinone, resorcinol, and catechol, polycyclic bifunctional phenols such as bisphenol A, and bisphenol F, halogenated compounds of these substances, and alkyl group substituted compounds of these substances. The molecular weights of these compounds may be freely selected, and they may also be used in combination.

The catalyst may be selected from those compounds which can act as a catalyst in the etherification of an epoxy group and a phenol hydroxyl group, and may consist of one or more members selected from a group consisting of hydroxides of alkaline metals, alcoholates of alkaline metals, phenolates of alkaline metals, alkyl phosphor catalysts, and aliphatic cyclic amine catalysts. The alkaline metals for the alkaline metal hydroxides, alkaline metal alcoholates, and alkaline metal phenolates may be selected from sodium, lithium, and potassium, and these catalysts may also be used in combination with others. The alkyl phosphor catalysts may be selected from tri-n-propylphosphine, and tri-n-butylphosphine. The aliphatic cyclic amine catalysts may be selected from 1,4-diazabicyclo[2,2,2]octane, 1,5-diazabicyclo[4,3,0]-5-nonane, and 1,8-diazabicyclo[5,4,0]-7-undecene. The amount of the catalyst that is used can be freely selected, but is typically in the range of 0.0001 to 0.2 mols for one mol of epoxy resin. If the amount of the catalyst is less, the polymerization reaction is too slow. If the amount of the catalyst is more, side reactions become so active that a straight-chain polymerization may not be achieved.

The ketone solvent having a boiling point of 100° C. or higher may consist of any solvent which can dissolve the base materials such as epoxy resin and phenol resin, and may be selected from aliphatic ketone solvents, alicyclic ketone solvents, and aliphatic diketone solvents, such as methyl-isobutyl-ketone, 2-heptanone, 4-heptanone, 2-octanone, cyclohexanone, and acetyl-acetone. These solvents may be used in combination, and may also be combined with other solvents such as amide solvents and ether solvents.

The amide solvents may be selected from formamide, N-methyl-formamide, N,N-dimethyl-formamide, acetoamide, N-methyl-acetoamide, N,N-dimethyl-acetoamide, N,N,N',N'-tetramethyl-urea, 2-pyrolidone, and N-methyl-pyrolidone.

With respect to the reaction conditions, the equivalent molecular ratio between the bifunctional epoxy resin and the bifunctional phenol resin is (epoxy group)/(phenol hydroxyl group)=1:0.9 to 1.1. If the equivalent ratio of the phenol hydroxyl group is less than 0.9, the straight-chain polymerization may not be achieved, and cross-linking resulting from side reactions may turn the material not soluble in the solvent. If the equivalent ratio is more than 1.1, the polymerization reaction may not proceed.

The temperature for the polymerization reaction is preferably in the range of 60° to 150° C. If the temperature is lower than 60° C., the speed of the polymerization reaction may be unacceptably slow. If the temperature is higher than 150° C., side reactions become so active that a straight-chain polymerization may not be achieved. Preferably, the temperature should be 130° C. or lower. The obtained high polymer epoxy resin is obtained in such a manner that the reduced viscosity is 0.6 dl/g (30° C., N,N-dimethyl-acetoamide).

The concentration of the solid content during the polymerization reaction should be kept 50 weight % or lower, or more preferably 30 weight % or lower. The higher the concentration is, the more active side reactions become, thereby preventing the straight-chain polymerization reaction. It is therefore preferred to carry out the polymerization reaction at a relatively high concentration. When high polymer epoxy resin having a straight-chain molecular structure is desired, the reaction temperature should be kept low, and the amount of the catalyst should be controlled.

The high polymer epoxy resin obtained by the above described method is capable of being formed into film, and believed to be polymerized without involving any substantial branching in the molecular structure so that film having a significant mechanical strength can be obtained. The obtained film has properties which are not unattainable in film obtained by molding conventional high polymer epoxy resins. The film according to the present invention has an extremely high mechanical strength, and is capable of significant elongation. The weight average molecular weight of this high polymer epoxy resin is preferably 50,000 or higher, and is more preferably 100,000 or higher. The high polymer epoxy resin is desired to be halogenated to make the bonding film flame retardant, and is, in particular, desired to be bromurated.

According to the first aspect of the present invention, denatured polyamide which is denatured by epoxy resin is used. The denatured polyamide can be obtained by reacting polyamide and epoxy resin, and includes one or more of epoxy groups in each molecule. The denatured polyamide may be obtained by the reaction of epoxy resin with (a) polyvalent carboxylic content consisting of 10 to 70 weight parts of polyalkylene-glycol or polycarbonate-diol which is carboxyl-terminated at both ends, and 90 to 30 weight parts of an other aliphatic or aromatic polyvalent carboxylic acid, and (b) carboxyl-terminated polyamide resin obtained by the reaction of di-isocyanate under the condition of (—COOH)/(—NCO)>1 so as to have an epoxy equivalent molecular weight of 1,000 to 40,000. Polyamide resin can be synthesized by the condensation reaction between polyvalent carboxylic acid and di-isocyanate which involves a release of carbon dioxide.

The polyalkylene-glycol which is carboxyl-terminated at both ends or the content (a) that may be used in the present invention may be selected from polyvalent carboxylic acids which can be obtained by the reaction between the following carboxylic acids and polytetramethylene-glycol, polypropylene-glycol and polyethylene-glycol. The polycarbonate-diol which is carboxyl-terminated at both ends may consist of polyvalent carboxylic acids which can be obtained by the reaction between the following carboxylic acids and straight-chain aliphatic polycarbonate-diol. The straight chain aliphatic polycarbonate-diol may be selected from such commercially available compounds as Plakcell CD series (marketed by Daicel Kagaku Kogyo KK), and Nipporan 980 and 981 (both marketed by Nihon Polyurethane Kogyo KK). This content is used by 10 weight % or more in view of the suitability for bonding, and by 70 weight % or more in view of heat resistance. Also, polytetramethylene-glycol is preferred in view of the bonding property and the resistance to moisture absorption, and preferably has a molecular weight in the range of 200 to 3,000.

The other aliphatic and aromatic polyvalent carboxylic acids include such aliphatic acids as succinic acid, glutaric acid, itaconic acid, adipic acid, azelaic acid, sebacic acid, decanoic acid, dodecanoic acid, and dimer acid, such aromatic dicarboxylic acids as isophthalic acid, terephthalic acid, phthalic acid, naphthalene-dicarboxylic acid, and oxydibenzoic acid, and such anhydrous aromatic carboxylic acids as anhydrous trimellitic acid, anhydrous pyromellitic acid, and anhydrous diphenylsulfon-tetracarboxylic acid. These may be used, either individually or in combination, by 90 to 30 weight parts.

The di-isocyanate for the content (b) may be selected from such aromatic di-isocyanates as 4,4'-diphenylmethane-di-isocyanate, 2,4-tolylene-di-isocyanate, 2,6-tolylene-di-isocyanate, 1,5-naphthalene-di-isocyanate, 3,3'-dimethyl-4,4'-diphenylmethane-di-isocyanate, p-phenylene-di-isocyanate, m-xylene-di-isocyanate, and m-tetramethylxylene-di-isocyanate, and such aliphatic di-isocyanate as hexamethylene-di-isocyanate, 2,2,4-trimethyl-hexamethylene-di-isocyanate, isophorone-di-isocyanate, 4,4'-dicyclohexyl-methane-di-isocyanate, trans-cyclohexane-1,4-di-isocyanate, hydrogen-added m-xylene-di-isocyanate, and lysine-di-isocyanate. Of these di-isocyanates, aromatic di-isocyanates are preferred in view of heat resistance, and 4,4'-diphenylmethane-di-isocyanate and tolylene-di-isocyanate are particularly preferred.

These may be used individually, but, more preferably, may be used in combination to control the tendency to crystallize. The content (b) is used in such a manner as to be (carboxyl group: —COOH)/(isocyanate group: —NCO)>1 or so as to have excess carboxylic acid over the content (a), and terminate the molecular structure of the polymer with carboxyl groups.

The above described reaction takes place at a temperature of 50° to 250° C. in a solvent which may be selected from lactones such as γ-butylolactone, amide solvents such as N-methyl-pyrolidone (NMP), dimethyl-acetomide, and dimethyl-formamide (DMF), sulfones such as tetramethylene-sulfone (sulfolane), and dimethyl-sulfooxide (DMSO), and ethers such as diethyleneglycol-dimethylether. In view of the reaction yield, and solubility as well as the volatility in the subsequent reaction steps, it is preferable to use a solvent essentially consisting of γ-butylolactone.

The epoxy resin that is to be used in the present invention may be selected from aromatic epoxy resins such as bisphenol A epoxy resin, bisphenol F epoxy resin, phenol novolac type epoxy resin, creosol novolac type epoxy resin, and naphthalene type epoxy resin, aliphatic epoxy resins such as neopentylglycol-diglycidylether, polypropyleneglycol-diglycidylether, and tetrahydrophthalic acid diglycidylester, and heterocyclic ring type epoxy resins such as triglycidyl-isocyanurate. Of these epoxy resins, bifunctional epoxy resins are preferred in view of reaction control, and aromatic epoxy resins are preferred in view of heat resistance. To attain a flame retardant property, bromurated epoxy resins are preferred. These may be used either individually or in combination. The epoxy resin is reacted with carboxyl acid terminated polyamide resin under the condition that (epoxy group)/(carboxyl acid)>1. If (epoxy group)/(carboxyl acid) <1, epoxy-terminated resin cannot be obtained. If (epoxy group)/(carboxyl acid)>2, epoxy resin reacts excessively so that the epoxy resin may turn into gel as a result of three-dimensional polymerization. The epoxy equivalent molecular weight of the thus obtained denatured polyamide epoxy resin is preferable in the range of 1,000 to 40,000. If the epoxy equivalent molecular weight is less than 1,000, the molecular weight is so small that the property to be molded into film may be lost. If the epoxy equivalent molecular weight exceeds 40,000, the viscosity of the varnish is such that forming the resin into film will be made difficult.

To ensure a favorable flexibility of the bonding film after it is cured, the polyamide molecular chain should include alkylene-glycol residue or polycarbonate-diol residue. To achieve both flexibility and resistance to chemical substances, the mixture ratio of the denatured polyamide should be in the range of 10 weight parts to 100 weight parts for 100 weight parts of high polymer epoxy resin.

The polyfunctional epoxy resins used in the present invention may consist of any compound having two or more epoxy groups in its molecular structure, and may be selected from epoxy resins obtained by glicidyl-etherifying phenols such as phenol novolac type epoxy resin, creosol novolac type epoxy resin, salicyl aldehyde novolac type epoxy resin, and bisphenol type epoxy resin, alicyclic epoxy resins, aliphatic chain epoxy resins, glicidylester type epoxy resins, glicidylamine type epoxy resins, hydantoin type epoxy resin, and isocyanurate type epoxy resin, epoxified polybutadiene, flexible epoxy resins, halogenated compounds of these epoxy resins, and hydrogen-added epoxy resins. These compounds may be used either individually or in combination. The content of polyfunctional epoxy resin is preferably 5 to 200 weight parts for 100 weight parts of the high polymer epoxy resin. If the content is less than 5 weight parts, the bonding force may become inadequate. If the content is more than 200 weight parts, the ease of handling of the film is undesirably impaired.

The bonding film for printed circuit boards according to the present invention employs a curing agent for the epoxy resin. The curing agent may consist of any compound as long as it is capable of curing epoxy resin, and may be selected from novolac type epoxy resin, dicyan-diamide, anhydrous acids, amines, imidazoles, and phosphines. These compounds may be used either individually or in combination. Known crosslinking agents for high polymer epoxy resins include polyisocyanates having two ore more isocyanate groups in each molecular structure and blocked polyisocyantes in which isocyanate groups are blocked by using a masking agent, and they include tolylene-di-isocyanate, isophorone-di-isocyanate, hexamethylene-di-isocyanate, diphenylmethane-di-isocyanate, and blocked polyisocyanates in which a polyisocyanate group is blocked by phenols, oximes, alcohols, and amines. These isocyanates can be used either individually or in combination. In particular, isophorone-di-isocyanate and tolylene-di-isocyanate blocked by novolac phenol resin are preferred in view of heat resistance when the material is applied to bonding film for printed circuit boards.

If desired, the composition may further include a silane coupling agent and/or a flame retardant. The silane coupling agent preferably consists of epoxy-silane, amino-silane, or urea-silane. The flame retardant may be selected from any reaction type flame retardants which can react with the contents of the bonding film according to the present invention, and additive type flame retardands which may include nitrogen type flame retardants, phosphor type flame retardants and inorganic flame retardants, and halogenated epoxy resins, preferably such as bromurated epoxy resin, polyfunctional halogenated phenols, preferably such as polyfunctional bromurated phenol.

These contents are dissolved or dispersed in a solvent so that a varnish may be obtained. The obtained varnish is applied over the base member in the form of a sheet roll, and is dried. The base member for applying the bonding film varnish may be freely selected from any known materials. When the bonding film is desired to be obtained as film, the varnish may be applied over carrier film such as polyethylene-terephthalate film or copper foil so that a bonding film attached to carrier film or a bonding film attached to copper foil can be obtained.

(B) Embodiments Using Polyamide Resin Having a Polyalkylene-Glycol Residue

According to a second aspect of the present invention, high polymer epoxy resin similar to that for the first aspect of the present invention may be used, and reference should be made to the relevant description for Embodiments (A).

According to the second aspect of the present invention, polyamide resin having a polyalkylene-glycol residue is used. The polyamide resin having a polyalkylene-glycol residue can be prepared by reacting organic diamine compound or an organic di-isocyanate with a dicarboxylic acid compound which includes dicarboxylic acid having two ends terminated by dicarboxylic acid produced from a reaction between polyalkylene-glycol and dicarboxylic acid.

The polyamide resin having a polyalkylene-glycol residue can be prepared by the reaction between (a) 10 to 70 weight parts of a dicarboxylic acid compound having two ends terminated by dicarboxylic acid which is obtained by the reaction between polyalkylene-glycol and dicarboxylic acid and selected as a polyvalent carboxylic acid content, and 90 to 30 weight parts of an other aliphatic or aromatic polyvalent carboxylic acid, and (b) di-isocyanate under the condition of (—COOH)/(—NCO)>1. Polyamide resin can be synthesized by the condensation reaction between polyvalent carboxylic acid and di-isocyanate which involves a release of carbon dioxide.

The polyalkylene-glycol which is carboxyl-terminated at both ends or the content (a) that may be used in the present invention may be selected from polyvalent carboxylic acids which can be obtained by the reaction between polytetramethylene-glycol, polypropylene-glycol and polyethylene-glycol, and the carboxylic acids which were listed previously in connection with the denatured polyamide (A). This content is used by 10 weight % or more in view of the suitability for bonding, and by 70 weight % or more in view of heat resistance. Also, polytetra-methylene-glycol is preferred in view of the bonding property and the resistance to moisture absorption, and preferably has a molecular weight in the range of 200 to 3,000.

The di-isocyanate for the content (b) may be selected from those listed previously in connection with the denatured polyamide (A). Of these di-isocyanates, aromatic di-isocyanates are preferred in view of heat resistance, and 4,4'-diphenylmethane-di-isocyanate and tolylene-di-isocyanate are particularly preferred. These may be used individually, but, more preferably, may be used in combination to control the tendency to crystallize. The content (b) is used in such a manner as to be (carboxyl group: —COOH) /(isocyanate group: —NCO)>1 or so as to have excess carboxylic acid over the content (a), and terminate the molecular structure of the polymer with carboxyl groups.

The above described reaction takes place at a temperature of 50° to 250° C. in a solvent which may be selected from lactones such as γ-butylolactone, amide solvents such as N-methyl-pyrolidone (NMP), dimethyl-acetomide, and dimethyl-formamide (DMF), sulfones such as tetramethylene-sulfone (sulfolane), and dimethyl-sulfooxide (DMSO), and ethers such as diethyleneglycol-dimethylether. In view of the reaction yield, and solubility as well as the volatility in the subsequent reaction steps, it is preferable to use a solvent essentially consisting of γ-butylolactone.

To improve the handling of the bonding film in its semi-cured state, the polyalkylene-glycol residue preferably consists of polytetra-methylene-glycol residue. To improve the handling of the bonding film in its semi-cured state and the heat resistance of the bonding film in its fully cured state, the content of the polyamide resin having a polyalkylene-glycol residue should be in the range of 1 to 100 weight parts for 100 weight parts of high polymer epoxy resin.

The polyfunctional epoxy resin for the second aspect of the present invention may consist of any compound having two or more epoxy groups in its molecular structure, and may be selected from those listed previously in connection with the denatured polyamide (A). These compounds may be used either individually or in combination. The content of polyfunctional epoxy resin is preferably 5 to 200 weight parts for 100 weight parts of the high polymer epoxy resin. If the content is less than 5 weight parts, the bonding force may become inadequate. If the content is more than 200 weight parts, the ease of handling of the film is undesirably impaired.

The bonding film for printed circuit boards according to the second aspect of the present invention also employs a curing agent for the epoxy resin. The curing agent may consist of any compound as long as it is capable of curing epoxy resin, and may be selected from those listed previously in connection with the denatured polyamide (A). These compounds may be used either individually or in combination. The same is true with the crosslinking agent, the silane coupling agent, and the flame retardant, and reference should be made to those listed in connection with the denatured polyamide (A).

The method for forming the bonding film varnish by dissolving or mixing the above described contents in a solvent can be freely selected. In view of uniformly dissolving or mixing the contents, the use of an organic solvent which can dissolve the contents of the bonding film is preferred. Any organic solvent may be used, but amide solvents, ketone solvents and lactone solvents are preferred in view of the ease of dissolving the contents. The amide solvents may include N-methyl-pyrolidone, formamide, N-methyl-formamide, N,N-dimethyl-formamide, acetoamide, N-methyl-acetoamide, and N,N-dimethyl-acetoamide.

The ketone solvents may be selected from acetone, methyl-ethyl-ketone, methyl-isobutyl-ketone, heptanone, cyclohexanone, octanone, phorone, isphorone and acetophenone. The lactone solvents may include γ-butylolactone.

These may be used either individually or in combination, and may also consist of the same solvent as that used for synthesizing the content of the bonding film. The way this varnish is applied is not different from that described in connection with Embodiments (A).

(C) Embodiments Using Solvent Soluble Polyamide Resin

According to a third aspect of the present invention, high polymer epoxy resin similar to that for the first aspect of the present invention may be used, and reference should be made to the relevant description for Embodiments (A).

According to the third aspect of the present invention, solvent soluble polyamide resin is used. The solvent soluble polyamide resin can be selected from any compounds which have an acid-amide bond, and are soluble either in water or a solvent. For instance, the solvent soluble polyamide resin may be selected from aliphatic copolymerized polyamides such as polyamide 6/66 and 6/66/12, aliphatic dicarboxylic acids such as adipic acid, succinic acid, glutaric acid, azelaic acid, sebacic acid and dimer acid, aromatic dicarboxylic acids such as isophthalic acid, terephthalic acid, and phthalic acid, aromatic diamines such as hexamethylene-diamine and diamino-diphenyl-methane, aliphatic diamines such as diaminodicyclohexyl-methane and isophorone-diamine, amorphous nylon which may be synthesized by using a component for blocking crystallization such as aromatic isocyanate and aliphatic isocyanate, polyamide elastomer containing a flexible component such as polyglycol, and formalin-denatured polyamide. The solvent for dissolving the polyamide may be selected from amide solvents, ketone solvents and lactone solvents or those having an aromatic residue because the high polymer epoxy resin is also soluble in such solvents. The solvent-soluble polyamide resin may, for instance, consist of Trogamide T-5000 (tradename: Daicel Huls KK) and CM4000 (tradename: Toray KK).

To improve the handing of the semi-cured bonding film and the heat resistance of the fully-cured bonding film, the content of the solvent-soluble polyamide resin should be preferably in the range of one to 100 weight parts for 100 parts of the high polymer epoxy resin.

The polyfunctional epoxy resin for the third aspect of the present invention may consist of any compound having two or more epoxy groups in its molecular structure, and may be selected from those listed previously in connection with the denatured polyamide (A). These compounds may be used either individually or in combination. The content of polyfunctional epoxy resin is preferably 5 to 200 weight parts for 100 weight parts of the high polymer epoxy resin. If the content is less than 5 weight parts, the bonding force may become inadequate. If the content is more than 200 weight parts, the ease of handling of the film is undesirably impaired.

The bonding film for printed circuit boards according to the second aspect of the present invention also employs a curing agent for the epoxy resin. The curing agent may consist of any compound as long as it is capable of curing epoxy resin, and may be selected from those listed previously in connection with the denatured polyamide (A). These compounds may be used either individually or in combination. The same is true with the crosslinking agent, the silane coupling agent, and the flame retardant, and reference should be made to those listed in connection with the denatured polyamide (A).

The method for forming the bonding film varnish by dissolving or mixing the above described contents in a solvent can be freely selected. In view of uniformly dissolving or mixing the contents, the use of an organic solvent which can dissolve the contents of the bonding film is preferred. Any organic solvent may be used, but amide solvents, ketone solvents and lactone solvents are preferred in view of the ease of dissolving the contents. The amide solvents may include N-methyl-pyrolidone, formamide, N-methyl-formamide, N,N-dimethyl-formamide, acetoamide, N-methyl-acetoamide, and N,N-dimethyl-acetoamide.

The ketone solvents may be selected from acetone, methyl-ethyl-ketone, methyl-isobutyl-ketone, heptanone, cyclohexanone, octanone, phorone, isphorone and acetophenone. The lactone solvents may include γ-butylolactone. These may be used either individually or in combination, and may also consist of the same solvent as that used for synthesizing the content of the bonding film. The way this varnish is applied is not different from that described in connection with Embodiments (A).

(D) Embodiments Using Halogenated High Polymer Epoxy Resin and Halogenated Epoxy Resin Denatured Polyamide According to a fourth aspect of the present invention, the halogenated high polymer epoxy resin of the present invention is suited to be formed into film, and can be made by polymerizing bifunctional epoxy resin and halogenated bifunctional phenol resin in a polymerization reaction solvent in the presence of a catalyst and in a heated condition. The equivalent molecular ratio between bifunctional epoxy resin and halogenated bifunctional phenol resin is (epoxy group)/(phenol hydroxyl group)=1:0.9 to 1.1, and the polymerization reaction solvent may consist of an amide solvent or a ketone solvent having a boiling point of 100° C. or higher. The polymerization process is carried out in the presence of a catalyst and at the polymerization reaction temperature of 150° C. or lower.

The bifunctional epoxy resin, and the catalyst may be selected in the same way as in Embodiments (A). The halogenated bifunctional phenol resin may be freely selected from halogenated compounds having two phenol hydroxyl groups, and may consist of halogenated compounds of monocyclic bifunctional phenols such as hydroquinone, resorcinol, and catechol, polycyclic bifunctional phenols such as bisphenol A, and bisphenol F, and alkyl group substituted compounds of these substances. The molecular weights of these compounds may be freely selected, and they may also be used in combination.

The ketone solvent having a boiling point of 100° C. or higher as well as the amide solvents may consist of any solvent which can dissolve the base materials such as epoxy resin and halogenated phenol, and may be selected from those mentioned in connection with Embodiments (A).

With respect to the reaction conditions, the equivalent molecular ratio between the bifunctional epoxy resin and the halogenated bifunctional phenol resin is (epoxy group)/(phenol hydroxyl group)=1:0.9 to 1.1. If the equivalent ratio of the phenol hydroxyl group is less than 0.9, the straight-chain polymerization may not be achieved, and cross-linking resulting from side reactions may turn the material not soluble in the solvent. If the equivalent ratio is more than 1.1, the polymerization reaction may not proceed.

The temperature for the polymerization reaction is preferably in the range of 60° to 150° C. If the temperature is lower than 60° C., the speed of the polymerization reaction may be unacceptably slow. If the temperature is higher than 150° C., side reactions become so active that a straight-chain polymerization may not be achieved. Preferably, the temperature should be 130° C. or lower. The obtained high polymer epoxy resin is obtained in such a manner that the reduced viscosity is 0.6 dl/g (30° C., N,N-dimethyl-acetoamide).

The concentration of the solid content during the polymerization reaction should be kept 50 weight % or lower, or more preferably 30 weight % or lower. The higher the concentration is, the more active side reactions become, thereby preventing the straight-chain polymerization reaction. It is therefore preferred to carry out the polymerization reaction at a relatively high concentration. When high polymer epoxy resin having a straight-chain molecular structure is desired, the reaction temperature should be kept low, and the amount of the catalyst should be controlled.

The halogentated high polymer epoxy resin obtained by the above described method is capable of being formed into film, and believed to be polymerized without involving any substantial branching in the molecular structure so that film having a significant mechanical strength can be obtained. The obtained film has properties which are not unattainable in film obtained by molding conventional high polymer epoxy resins. The film according to the present invention has an extremely high mechanical strength, and is capable of significant elongation. The weight average molecular weight of this high polymer epoxy resin is preferably 50,000 or higher, and is more preferably 100,000 or higher.

According to the fourth aspect of the present invention, the halogenated epoxy resin denatured polyamide consists of denatured polyamide which is denatured by halogenated epoxy resin. The denatured polyamide can be obtained by reacting polyamide and halogenated epoxy resin, and includes one or more of epoxy groups in each molecule. In order to improve the flexibility of the cured bonding film, the polyamide molecular chain preferably includes a polyalkylene-glycol residue or a polycarbonate-diol residue. The denatured polyamide having such a structure may be produced, for instance, by reacting a dicarboxylic acid compound having two ends terminated by carboxylic acid, such as those produced by the reaction between polyalkylene-glycol or polycarbonate-diol and dicarboxylic acid, with an organic diamine compound or an organic di-isocyanate compound to synthesize acid-terminated polyamide, and reacting the synthesize acid-terminated polyamide with halogenated epoxy resin.

The halogenated epoxy resin denatured polyamide may be obtained by the reaction of halogenated epoxy resin, under the condition of (epoxy group)/(carboxyl acid group)>1, with (a) polyvalent carboxylic content consisting of 10 to 70 weight parts of polyalkylene-glycol or polycarbonate-diol which is carboxyl-terminated at both ends, and 90 to 30 weight parts of an other aliphatic or aromatic polyvalent carboxylic acid, and (b) carboxyl-terminated polyamide resin obtained by the reaction of di-isocyanate under the condition of (—COOH)/(—NCO)>1, so as to have an epoxy equivalent molecular weight of 1,000 to 40,000. Polyamide resin can be synthesized by the condensation reaction between polyvalent carboxylic acid and di-isocyanate which involves a release of carbon dioxide.

The polyalkylene-glycol which is carboxyl-terminated at both ends or the content (a) and di-isocyanate for the content (b) may be selected in a similar fashion as in Embodiments (A).

The halogenated epoxy resin that is to be used in the fourth aspect of the present invention may be selected from aromatic epoxy resins such as bisphenol A epoxy resin, bisphenol F epoxy resin, phenol novolac type epoxy resin, creosol novolac type epoxy resin, and naphthalene type epoxy resin, aliphatic epoxy resins such as neopentylglycol-diglycidylether, polypropyleneglycol-diglycidylether, and tetrahydrophthalic acid diglycidylester, and heterocyclic ring type epoxy resins such as triglycidyl-isocyanurate. Of these epoxy resins, bifunctional epoxy resins are preferred in view of reaction control, and aromatic epoxy resins are preferred in view of heat resistance. These may be used either individually or in combination.

The epoxy resin is reacted with carboxyl acid terminated polyamide resin under the condition that (epoxy group)/(carboxyl acid)>1. If (epoxy group)/(carboxyl acid)<1, epoxy-terminated resin cannot be obtained. If (epoxy group)/(carboxyl acid)>2, epoxy resin reacts excessively so that the epoxy resin may turn into gel as a result of three-dimensional polymerization. The epoxy equivalent molecular weight of the thus obtained halogenated epoxy resin denatured polyamide is preferable in the range of 1,000 to 40,000. If the epoxy equivalent molecular weight is less than 1,000, the molecular weight is so small that the property to be molded into film may be lost. If the epoxy equivalent molecular weight exceeds 40,000, the viscosity of the varnish is such that forming the resin into film will be made difficult.

To achieve both flexibility and high heat resistance, the mixture ratio of the halogenated epoxy resin denatured polyamide should be in the range of 10 weight parts to 200 weight parts for 100 weight parts of halogenated high polymer epoxy resin.

The polyfunctional epoxy resins used in the fourth aspect of the present invention may consist of any compound having two or more epoxy groups in its molecular structure, and may be selected from epoxy resins obtained by glicidyl-etherifying phenols such as phenol novolac type epoxy resin, creosol novolac type epoxy resin, salicyl aldehyde novolac type epoxy resin, and bisphenol type epoxy resin, alicyclic epoxy resins, aliphatic chain epoxy resins, glicidy-lester type epoxy resins, glicidylamine type epoxy resins, hydantoin type epoxy resin, and isocyanurate type epoxy resin, epoxified polybutadiene, flexible epoxy resins, halo-genated compounds of these epoxy resins, and hydrogen-added epoxy resins. These compounds may be used either individually or in combination. The content of polyfunctional epoxy resin is preferably 5 to 200 weight parts for 100 weight parts of the high polymer epoxy resin. If the content is less than 5 weight parts, the bonding force may become inadequate. If the content is more than 200 weight parts, the ease of handling of the film is undesirably impaired.

The bonding film for printed circuit boards according to the fourth aspect of the present invention employs a curing agent for the epoxy resin. The curing agent may be selected in a similar fashion as in Embodiments (A). Likewise, if desired, the composition may further include a silane coupling agent and/or a flame retardant. The silane coupling agent preferably consists of epoxy-silane, amino-silane, or urea-silane. The flame retardant may be selected from any reaction type flame retardants which can react with the contents of the bonding film according to the present invention, and additive type flame retardands which may include nitrogen type flame retardants, phosphor type flame retardants and inorganic flame retardants, and halogenated epoxy resins, preferably such as bromurated epoxy resin, polyfunctional halogenated phenols, preferably such as polyfunctional bromurated phenol.

These contents are dissolved or dispersed in a solvent so that a varnish may be obtained. The obtained varnish is applied over the base member in the form of a sheet roll, and is dried. The base member for applying the bonding film varnish may be freely selected from any known materials. When the bonding film is desired to be obtained as film, the varnish may be applied over carrier film such as polyethylene-terephthalate film or copper foil so that a bonding film attached to carrier film or a bonding film attached to copper foil can be obtained.

Now the present invention is described in the following in terms of specific embodiments, but they should not be understood as limiting the present invention in any way.

EMBODIMENTS (A)

SYNTHESIS OF HIGH POLYMER EPOXY RESIN

Bisphenol A epoxy resin (epoxy equivalent weight 172) selected as a bifunctional epoxy resin and tetrabromo-bisphenol A (hydroxyl equivalent weight 272) selected as a halogenated bifunctional phenol resin were mixed at the ratio of (epoxy group)/(phenol hydroxyl group)=1/1.02, and were subjected to a polymerization reaction in the presence of a catalyst consisting of 0.065 mols of lithium hydroxide for one mol of epoxy resin and in a solvent consisting of N,N-dimethylaceto-amide, so that the solid concentration in the solution may be 30 weight %, at 120° C. for 10 hours under a heated condition. The obtained high polymer demonstrated a styrene-converted weight average molecular weight of 155,000 as measured by a gel penetration chromatography (GPC), and the reduced viscosity was 1.22 dl/g in N,N-dimethyl-acetoamide at 30° C.

SYNTHESIS OF DENATURED POLYAMIDE

I) Denatured polyamide obtained by acid terminated polyamide having polytetramethylene-glycol residue reacting with bisphenol A epoxy resin 1,000 g of polytetramethylene-glycol (average molecular weight 1,000), and 405 g of sebacic acid were charged into a flask equipped with a stirrer, a reflux condenser, an inlet for inert gas, and a thermometer. The mixture was raised in temperature to 200° C. over two hours, and, after 3 hours of reaction, was cooled to obtain a polytetramethylene-glycol compound having two ends terminated by carboxylic acid having an acid value of 81.9 and a molecular weight of 1,370. 100 g of γ-butylolactone, and 50 g of N-methyl-pyrolidone were charged into a flask equipped with a stirrer, a reflux condenser, an inlet for inert gas, and a thermometer. Into this flask were additionally charged 37.9 g of the obtained polytetramethylene-glycol compound having two ends terminated by carboxylic acid, 10.9 g of adipic acid and 10.9 g of sebacic acid selected as aliphatic acids, 18.0 g of isophthalic acid selected as an aromatic carboxylic acid, and 25.5 g of 4,4'-diphenylmethane-di-isocyanate (MDI) and 22.4 g of tolylene-di-isocyanate (TDI) selected as di-isocyanates. The mixture was raised in temperature to 200° C., and, after 4 hours of reaction, was cooled to obtain polyamide resin having a resin content of 40 weight %, and an acid value of 54.8. 22.4 g of EPOMIK R140 (tradename: bisphenol A epoxy resin with an epoxy equivalent weight of 190 marketed by Mitsui Sekiyu Kagaku Kogyo KK) was additionally charged into the flask, and, after 3 hours of reaction at 150° C., dimethyl-formamide was added thereto so as to achieve a solid content of 35 weight %. This yielded denatured polyamide having an epoxy equivalent weight of 9,300.

II) Denatured polyamide obtained by acid terminated polyamide having polycarbonate-diol residue reacting with bisphenol A epoxy resin 1,000 g of polycarbonate-diol (marketed by Daicel Kagaku Kogyo KK under the tradename of Plakcell CD210, average molecular weight 1,000), and 405 g of sebacic acid were charged into a flask equipped with a stirrer, a reflux condenser, an inlet for inert gas, and a thermometer. The mixture was raised in temperature to 200° C. over two hours, and, after 3 hours of reaction, was cooled to obtain a polycarbonate-diol compound having two ends terminated by carboxylic acid having an acid value of 82.5 and a molecular weight of 1,360. 100 g of γ-butylolactone, and 50 g of N-methyl-pyrolidone were charged into a flask equipped with a stirrer, a reflux condenser, an inlet for inert gas, and a thermometer. Into this flask were additionally charged 57.7 g of the obtained polycarbonate-diol compound having two ends terminated by carboxylic acid, 4.9 g of adipic acid and 6.8 g of sebacic acid selected as aliphatic acids, 11.2 g of isophthalic acid selected as an aromatic carboxylic acid, and 22.1 g of 4,4'-diphenylmethane-di-isocyanate (MDI) and 10.3 g of tolylene-di-isocyanate (TDI) selected as di-isocyanates. The mixture was raised in temperature to 200° C., and, after 4 hours of reaction, was cooled to obtain polyamide resin having an acid value of 40.2. 16.2 g of EPOMIK R140 (tradename: bisphenol A epoxy resin with an epoxy equivalent weight of 190 marketed by Mitsui Sekiyu Kagaku Kogyo KK) was additionally charged into the flask, and, after 3 hours of reaction at 150° C., dimethyl-formamide was added thereto so as to achieve a solid content of 35 weight %. This yielded denatured polyamide having an epoxy equivalent weight of 12,000.

(Embodiment #A-1)

100 weight parts of high polymer epoxy resin having a weight averaged molecular weight of 155,000 selected as a high polymer epoxy resin and synthesized as described above, 20 weight parts of denatured polyamide selected as a denature polyamide and obtained by reacting acid-terminated polyamide having polytetramethylene-glycol residue with bisphenol A epoxy resin, 30 weight parts of bisphenol A epoxy resin (epoxy equivalent weight, 172 g/equivalent) selected as a polyfunctional epoxy resin, and 10 weight parts of isophorone-di-isocyanate which is blocked by phenol novolac and selected as a curing/crosslinking agent were dissolved in an organic solvent containing dimethyl-acetoamide, and a bonding film varnish having a solid concentration of 40 weight % was obtained. The bonding film varnish was applied over polyethylene-phthalate film having a thickness of 50 μm and serving as carrier film so that the dry thickness of the bonding film may be 50 μm. The assembly was dried for two minutes at 100° C. and for two minutes at 150° C., and the carrier film was peeled off to obtain bonding film in semi-cured state. The heat resistance and bonding property of the bonding film was evaluated in terms of the heat resistance of a laminated board against soldering heat and the force required to peel off the copper foil. The semi-cured bonding film was placed between 18 μm thick copper foil and a glass reinforced epoxy resin board laminated with copper foil to which an inner layer bonding process (oxidization and reduction process) was applied, and the assembly was pressed and heated for 60 minutes under the condition of 170° C. and 40 kg/cm².

The obtained laminated board was subjected to the heat resistance (float) and copper peeling strength tests according to JIS C6481. The sample did not demonstrate any bloating when exposed to soldering heat of 260° C. for 180 seconds, and the force required to peel off the 18 μm thick copper foil was 1.6 kN/m. The flexibility of the bonding film was evaluated by subjecting cured bonding film to the tensile and repeated bending tests which are described hereinafter, and the resistance to chemicals was evaluated by dipping the cured bonding film in various chemicals. When cured bonding film obtained by heating semi-cured bonding film at 170° C. for 30 minutes was subjected to the tensile test at the tensioning speed of 50 mm/minute, the elongation was 30%. When the bonding film was subjected to the repeated bending test according to JIS C-5016 under the condition of the bending radius of curvature of 0.38 mm and the load of 500 g, the cured bonding film ruptured after 200 cycles of bending. The cured bonding film was not affected when it was dipped in water solutions containing 10 weight % of hydrochloric acid, and 10 weight % of sodium hydroxide, respectively.

(Embodiment #A-2)

Semi-cured bonding film was obtained substantially identically as Embodiment #A-1 except for that the denature polyamide was used by 50 weight parts instead of 20 weight parts. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #A-1. The sample did not demonstrate any bloating when exposed to soldering heat of 260° C. for 180 seconds, and the force required to peel off the 18 μm thick copper foil was 1.7 kN/m. When the cured bonding film obtained by heating semi-cured bonding film at 170° C. for 30 minutes was subjected to the tensile test at the tensioning speed of 50 mm/minute, the elongation was 100%. When the bonding film was subjected to the repeated bending test according to JIS C-5016 under the condition of the bending radius of curvature of 0.38 mm and the load of 500 g, the cured bonding film ruptured after 800 cycles of bending. The cured bonding film was not affected when it was dipped in water solutions containing 10 weight % of hydrochloric acid, and 10 weight % of sodium hydroxide, respectively.

(Embodiment #A-3)

Semi-cured bonding film was obtained substantially identically as Embodiment #A-1 except for that the denature polyamide was used by 80 weight parts instead of 20 weight parts. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #A-1. The sample did not demonstrate any bloating when exposed to soldering heat of 260° C. for 180 seconds, and the force required to peel off the 18 μm thick copper foil was 1.7 kN/m. When the cured bonding film obtained by heating semi-cured bonding film at 170° C. for 30 minutes was subjected to the tensile test at the tensioning speed of 50 mm/minute, the elongation was 200%. When the bonding film was subjected to the repeated bending test according to JIS C-5016 under the condition of the bending radius of curvature of 0.38 mm and the load of 500 g, the cured bonding film ruptured after 800 cycles of bending. The cured bonding film was not affected when it was dipped in water solutions containing 10 weight % of hydrochloric acid, and 10 weight % of sodium hydroxide, respectively.

(Embodiment #A-4)

Semi-cured bonding film was obtained substantially identically as Embodiment #A-1 except for that 50 weight parts of denatured polyamide obtained by reacting bisphenol A epoxy resin with acid-terminated polyamide having polycarbonate-diol residue was used instead of 20 weight parts of denature polyamide obtained by reacting acid-terminated polyamide having polytetramethylene-glycol residue with bisphenol A epoxy resin. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #A-1. The sample did not demonstrate any bloating when exposed to soldering heat of 260° C. for 180 seconds, and the force required to peel off the 18 μm thick copper foil was 1.5 kN/m. When the cured bonding film obtained by heating semi-cured bonding film at 170° C. for 30 minutes was subjected to the tensile test at the tensioning speed of 50 mm/minute, the elongation was 30%. When the bonding film was subjected to the repeated bending test according to JIS C-5016 under the condition of the bending radius of curvature of 0.38 mm and the load of 500 g, the cured bonding film ruptured after 200 cycles of bending. The cured bonding film was not affected when it was dipped in water solutions containing 10 weight % of hydrochloric acid, and 10 weight % of sodium hydroxide, respectively.

(Comparative Example #A-1)

Semi-cured bonding film was obtained substantially identically as Embodiment #A-1 except for that the denatured polyamide resin of Embodiment #A-1 was omitted. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #A-1. The sample did not demonstrate any bloating when exposed to soldering heat of 260° C. for 180 seconds, and the force required to peel off the 18 μm thick copper foil was 1.6 kN/m. When the cured bonding film obtained by heating semi-cured bonding film at 170° C. for 30 minutes was subjected to the tensile test at the tensioning speed of 50 mm/minute, the elongation was 5%. When the bonding film was subjected to the repeated bending test according to JIS C-5016 under the condition of the bending radius of curvature of 0.38 mm and the load of 500 g, the cured bonding film ruptured after 50 cycles of bending. The cured bonding film was not affected when it was dipped in water solutions containing 10 weight % of hydrochloric acid, and 10 weight % of sodium hydroxide, respectively.

(Comparative Example #A-2)

Semi-cured bonding film was obtained substantially identically as Embodiment #A-1 except for that 50 weight parts of phenoxy resin (marketed by Toto Kasei KK under the tradename of YP-50) was used instead of the denatured polyamide resin of Embodiment #A-1. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #A-1. The sample did not demonstrate any bloating when exposed to soldering heat of 260° C. for 180 seconds, and the force required to peel off the 18 μm thick copper foil was 1.4 kN/m. When the cured bonding film obtained by heating semi-cured bonding film at 170° C. for 30 minutes was subjected to the tensile test at the tensioning speed of 50 mm/minute, the elongation was 5%. When the bonding film was subjected to the repeated bending test according to JIS C-5016 under the condition of the bending radius of curvature of 0.38 mm and the load of 500 g, the cured bonding film ruptured after 50 cycles of bending. The cured bonding film was not affected when it was dipped in water solutions containing 10 weight % of hydrochloric acid, and 10 weight % of sodium hydroxide, respectively.

The properties of Embodiments #A-1 to #A-4 and Comparative Examples #A-1 and #A-2 are summarized in Table 1.

ends terminated by carboxylic acid, 10.9 g of adipic acid and 10.9 g of sebacic acid selected as aliphatic acids, 18.0 g of isophthalic acid selected as an aromatic carboxylic acid, and 25.5 g of 4,4'-diphenylmethane-di-isocyanate (MDI) and 17.7 g of tolylene-di-isocyanate (TDI) selected as di-isocyanates. The mixture was raised in temperature to 200° C., and, after 4 hours of reaction, was cooled to obtain polyamide resin having a polyalkylene-diol residue with a resin content of 40 weight %, and an acid value of 54.8.

TABLE 1

| items | | Embodiments | | | | Comparative Examples | |
|---|---|---|---|---|---|---|---|
| | | #A-1 | #A-2 | #A-3 | #A-4 | #A-1 | #A-2 |
| high polymer epoxy resin | | 100 | 100 | 100 | 100 | 100 | 100 |
| denatured polyamide including polytetramethylene-glycol | | 20 | 50 | 80 | 0 | 0 | 0 |
| denatured polyamide including polycarbonate-diol | | 0 | 0 | 0 | 50 | 0 | 0 |
| phenoxy resin | | 0 | 0 | 0 | 0 | 0 | 50 |
| bisphenol A epoxy resin | | 30 | 30 | 30 | 30 | 30 | 30 |
| blocked isocyanate | | 10 | 10 | 10 | 10 | 10 | 10 |
| 260° C. soldering heat resistance (180 seconds) | | not affected | not affected | not affected | not affected | not affected | not affected |
| copper foil peeling strength (kN/m) | | 1.6 | 1.7 | 1.7 | 1.5 | 1.6 | 1.4 |
| elongation (%) | | 30 | 100 | 200 | 30 | 5 | 5 |
| repeated bending strength (cycles) | | 200 | 800 | 3,000 | 200 | 50 | 50 |
| resistance to | 10% HCl Aq | not affected | not affected | not affected | not affected | not affected | not affected |
| chemicals | 10% NaOH Aq | not affected | not affected | not affected | not affected | not affected | not affected |

EMBODIMENTS (B)

SYNTHESIS OF HIGH POLYMER EPOXY RESIN

Bisphenol A epoxy resin (epoxy equivalent weight 172) selected as an epoxy resin and tetrabromo-bisphenol A (hydroxyl equivalent weight 272) selected as a halogenated bifunctional phenol resin were mixed at the ratio of (epoxy group)/(phenol hydroxyl group)=1/1.02, and were subjected to a polymerization reaction in the presence of a catalyst consisting of 0.065 mols of lithium hydroxide for one mol of epoxy resin and in a solvent consisting of N,N-dimethylaceto-amide, so that the solid concentration in the solution may be 30 weight %, at 120° C. for 10 hours under a heated condition. The obtained high polymer demonstrated a styrene-converted weight averaged molecular weight of 155,000 as measured by a gel penetration chromatography (GPC), and the reduced viscosity was 1.22 dl/g in N,N-dimethyl-acetoamide at 30° C.

SYNTHESIS OF POLYAMIDERESIN HAVING A POLYALKYLENE-GLYCOL RESIDUE 1,000 g of polytetramethylene-glycol (average molecular weight 1,000), and 405 g of sebacic acid were charged into a flask equipped with a stirrer, a reflux condenser, an inlet for inert gas, and a thermometer. The mixture was raised in temperature to 200° C. over two hours, and, after 3 hours of reaction, was cooled to obtain a polytetramethylene-glycol compound having two ends terminated by carboxylic acid having an acid value of 81.9 and a molecular weight of 1,370. 100 g of γ-butylolactone, and 50 g of N-methyl-pyrolidone were charged into a flask equipped with a stirrer, a reflux condenser, an inlet for inert gas, and a thermometer. Into this flask were additionally charged 37.9 g of the obtained polytetramethylene-glycol compound having two (Embodiment #B-1)

100 weight parts of high polymer epoxy resin having a weight averaged molecular weight of 155,000 selected as a high polymer epoxy resin and synthesized as described above, 5 weight parts of polyamide resin having a polytetramethylene-glycol residue selected as polyamide resin having a polyalkylene-glycol residue, 30 weight parts of bisphenol A epoxy resin (epoxy equivalent weight, 172 g/equivalent) selected as a polyfunctional epoxy resin, and 10 weight parts of isophorone-di-isocyanate which is blocked by phenol novolac were dissolved in an organic solvent containing dimethyl-acetoamide, and a bonding film varnish having a solid concentration of 40 weight % was obtained. The bonding film varnish was applied over polyethylene-phthalate film having a thickness of 50 μm and serving as carrier film so that the dry thickness of the bonding film may be 50 μm. The assembly was dried for two minutes at 100° C. and for two minutes at 150° C. This bonding film mounted on carrier film did not produce any debris when cut, and demonstrated a favorable handling without producing cracks as it is peeled off from the carrier film. The bonding film was placed between 18 μm thick copper foil and a glass reinforced epoxy resin board laminated with copper foil to which an inner layer bonding process (oxidization and reduction process) was applied with the coarse surface of the copper foil facing the bonding film, and the assembly was pressed and heated for 60 minutes under the condition of 170° C. and 40 kg/cm². The sample did not demonstrate any bloating when exposed to soldering heat of 260° C. for 180 seconds (solder heat resistance test according to JIS C6484), and the force required to peel off the 18 μm thick copper foil was 1.6 kN/m.

(Embodiment #B-2)

Bonding film varnish was obtained substantially ide nti-cally as Embodiment #B-1 except for that the polyamide resin was used by 10 weight parts instead of 5 weight parts, and bonding film mounted on carrier film was prepared in similar fashion. This bonding film mounted on carrier film did not produce any debris when cut, and demonstrated a favorable handling without producing cracks as it is peeled off from the carrier film. The bonding film was placed between 18 μm thick copper foil and a glass reinforced epoxy resin board laminated with copper foil to which an inner layer bonding process was applied with the coarse surface of the copper foil facing the bonding film, and the assembly was pressed and heated for 60 minutes under the condition of 170° C. and 40 kg/cm². The sample did not demonstrate any bloating when exposed to soldering heat of 260° C. for 180 seconds, and the force required to peel off the 18 μm thick copper foil was 1.7 kN/m.

(Embodiment #B-3)

Bonding film varnish was obtained substantially identically as Embodiment #B-1 except for that the bisphenol A epoxy resin was used by 60 weight parts instead of 30 weight parts, and bonding film mounted on carrier film was prepared in similar fashion. This bonding film mounted on carrier film did not produce any debris when cut, and demonstrated a favorable handling without producing cracks as it is peeled off from the carrier film. The bonding film was placed between 18 μm thick copper foil and a glass reinforced epoxy resin board laminated with copper foil to which an inner layer bonding process was applied with the coarse surface of the copper foil facing the bonding film, and the assembly was pressed and heated for 60 minutes under the condition of 170° C. and 40 kg/cm². The sample did not demonstrate any bloating when exposed to soldering heat of 260° C. for 180 seconds, and the force required to peel off the 18 μm thick copper foil was 1.7 kN/m.

(Embodiment #B-4)

Bonding film varnish was obtained substantially identically as Embodiment #B-1 except for that the isophorone-di-isocyanate blocked by phenol novolac was omitted, and bonding film mounted on carrier film was prepared in similar fashion. This bonding film mounted on carrier film did not produce any debris when cut, and demonstrated a favorable handling without producing cracks as it is peeled off from the carrier film. The bonding film was placed between 18 μm thick copper foil and a glass reinforced epoxy resin board laminated with copper foil to which an inner layer bonding process was applied with the coarse surface of the copper foil facing the bonding film, and the assembly was pressed and heated for 60 minutes under the condition of 170° C. and 40 kg/cm². The sample did not demonstrate any bloating when exposed to soldering heat of 260° C. for 180 seconds, and the force required to peel off the 18 μm thick copper foil was 1.4 kN/m.

(Comparative Example #B-1)

Bonding film varnish was obtained substantially identically as Embodiment #B-1 except for that the polyamide resin was omitted, and bonding film mounted on carrier film was prepared in similar fashion. This bonding film mounted on carrier film produce a substantial amount of debris when cut, and the bonding film of a desired size could not be obtained because the bonding film demonstrated cracks as it is peeled off from the carrier film. The bonding film was placed between 18 μm thick copper foil and a glass reinforced epoxy resin board laminated with copper foil to which an inner layer bonding process was applied with the coarse surface of the copper foil facing the bonding film, and the assembly was pressed and heated for 60 minutes under the condition of 170° C. and 40 kg/cm². The sample did not demonstrate any bloating when exposed to soldering heat of 260° C. for 180 seconds, and the force required to peel off the 18 μm thick copper foil was 1.6 kN/m.

The properties of Embodiments #B-1 to #B-4 and Comparative Example #B-1 are summarized in Table 2.

TABLE 2

| items | Embodiments | | | | Comparative Example |
|---|---|---|---|---|---|
| | #B-1 | #B-2 | #B-3 | #B-4 | #B-1 |
| high polymer epoxy resin | 100 | 100 | 100 | 100 | 100 |
| polyamide resin including a polytetramethylene glycol residue | 5 | 10 | 10 | 5 | 0 |
| bisphenol A epoxy resin | 30 | 30 | 60 | 30 | 30 |
| blocked isocyanate | 10 | 10 | 10 | 0 | 10 |
| debris | none | none | none | none | produced |
| cracks | none | none | none | none | occurred |
| 260° C. soldering heat resistance (180 seconds) | not affected | not affected | not affected | not affected | not affected |
| copper foil peeling force (kN/m) | 1.6 | 1.7 | 1.7 | 1.4 | 1.6 |

EMBODIMENTS (C)

SYNTHESIS OF HIGH POLYMER EPOXY RESIN

Bisphenol A epoxy resin (epoxy equivalent weight 172) selected as an epoxy resin and tetrabromo-bisphenol A (hydroxyl equivalent weight 272) selected as a halogenated bifunctional phenol resin were mixed at the ratio of (epoxy group)/(phenol hydroxyl group)=1/1.02, and were subjected to a polymerization reaction in the presence of a catalyst consisting of 0.065 mols of lithium hydroxide for one mol of epoxy resin and in a solvent consisting of N,N-dimethylaceto-amide, so that the solid concentration in the solution may be 30 weight %, at 120° C. for 10 hours under a heated condition. The obtained high polymer demonstrated a styrene-converted weight averaged molecular weight of 155,000 as measured by a gel penetration chromatography (GPC), and the reduced viscosity was 1.22 dl/g in N,N-dimethyl-acetoamide at 30° C.

(Embodiment #C-1)

100 weight parts of high polymer epoxy resin having a weight averaged molecular weight of 155,000 selected as a high polymer epoxy resin and synthesized as described above, 20 weight parts of T-5000 (tradename: Daicel Huls KK) selected as solvent soluble polyamide, 20 weight parts of bisphenol A epoxy resin (epoxy equivalent weight 172) selected as a polyfunctional epoxy resin, and 10 weight parts of isophorone-di-isocyanate which is blocked by phenol novolac were dissolved in an organic solvent containing dimethyl-acetoamide, and a bonding film varnish having a solid concentration of 40 weight % was obtained. The bonding film varnish was applied over polyethylene-phthalate film having a thickness of 50 μm and serving as carrier film so that the dry thickness of the bonding film may be 50 μm. The assembly was dried for two minutes at 100° C. and for two minutes at 150° C. This bonding film mounted on carrier film did not produce any debris when cut, and demonstrated a favorable handling without producing cracks as it is peeled off from the carrier film. The bonding film was placed between two layers of 18 μm thick copper foil, and the assembly was pressed and heated for 60 minutes under the condition of 170° C. and 4 MPa. The force required to peel off the 18 μm thick copper foil was 1.5 kN/m.

(Embodiment #C-2)

Bonding film varnish was obtained substantially identically as Embodiment #C-1 except for that phonol novolac epoxy resin (epoxy equivalent weight 175) was used instead of the bisphenol A epoxy resin of Embodiment #C-1, and bonding film mounted on carrier film was prepared in similar fashion. This bonding film mounted on carrier film did not produce any debris when cut, and demonstrated a favorable handling without producing cracks as it is peeled off from the carrier film. The bonding film was placed between two layers of 18 μm thick copper foil, and the assembly was pressed and heated for 60 minutes under the condition of 170° C. and 4 MPa. The force required to peel off the 18 μm thick copper foil was 1.5 kN/m.

(Embodiment #C-3)

Bonding film varnish was obtained substantially identically as Embodiment #C-2 except for that the isophorone-di-isocyanate blocked by phenol novolac of Embodiment #C-1 was omitted, and bonding film mounted on carrier film was prepared in similar fashion. This bonding film mounted on carrier film did not produce any debris when cut, and demonstrated a favorable handling without producing cracks as it is peeled off from the carrier film. The bonding film was placed between two layers of 18 μm thick copper foil, and the assembly was pressed and heated for 60 minutes under the condition of 170° C. and 4 MPa. The force required to peel off the 18 μm thick copper foil was 1.4 kN/m.

(Comparative Example #C-1)

Bonding film varnish was obtained substantially identically as Embodiment #C-1 except for that the solven soluble polyamide resin was omitted, and bonding film mounted on carrier film was prepared in similar fashion. This bonding film mounted on carrier film produce a substantial amount of debris when cut, and the handling was poor because the bonding film demonstrated cracks as it is peeled off from the carrier film. The bonding film was placed between two layers of 18 μm thick copper foil, and the assembly was pressed and heated for 60 minutes under the condition of 170° C. and 4 MPa. The force required to peel off the 18 μm thick copper foil was 1.6 kN/m.

The properties of Embodiments #C-1 to #C-3 and Comparative Example #C-1 are summarized in Table 3.

TABLE 3

| items | Embodiments | | | Comparative Example |
|---|---|---|---|---|
| | #C-1 | #C-2 | #C-3 | #C-1 |
| high polymer epoxy resin | 100 | 100 | 100 | 100 |
| solvent soluble polyamide resin | 20 | 20 | 20 | 0 |
| bisphenol A epoxy resin | 30 | 0 | 0 | 30 |
| phenol novolac epoxy resin | 0 | 30 | 30 | 0 |
| blocked isocyanate | 10 | 10 | 0 | 10 |
| debris | none | none | none | produced |
| cracks | none | none | none | occurred |
| copper foil peeling force (kN/m) | 1.5 | 1.5 | 1.4 | 1.6 |

EMBODIMENTS (D)

SYNTHESIS OF HALOGENATED HIGH POLYMER EPOXY RESIN

Bisphenol A epoxy resin (epoxy equivalent weight 172) selected as a bifunctional epoxy resin and tetrabromo-bisphenol A (hydroxyl equivalent weight 272) selected as a halogenated bifunctional phenol resin were mixed at the ratio of (epoxy group)/(phenol hydroxyl group)=1/1.02, and were subjected to a polymerization reaction in the presence of a catalyst consisting of 0.065 mols of lithium hydroxide for one mol of epoxy resin and in a solvent consisting of N,N-dimethylaceto-amide, so that the solid concentration in the solution may be 30 weight %, at 120° C. for 10 hours under a heated condition. The obtained high polymer demonstrated a styrene-converted weight average molecular weight of 155,000 as measured by a gel penetration chromatography (GPC), and the reduced viscosity was 1.22 dl/g in N,N-dimethyl-acetoamide at 30° C.

SYNTHESIS OF HALOGENATED EPOXY RESIN DENATURED POLYAMIDE

I) Halogenated Epoxy Resin Denatured Polyamide Having a Polytetramethylene-Glycol Residue 1,000 g of polytetramethylene-glycol (average molecular weight 1,000), and 405 g of sebacic acid were charged into a flask equipped with a stirrer, a reflux condenser, an inlet for inert gas, and a thermometer. The mixture was raised in temperature to 200° C. over two hours, and, after 3 hours of reaction, was cooled to obtain a polytetramethylene-glycol compound having two ends terminated by carboxylic acid having an acid value of 81.9 and a molecular weight of 1,370. 100 g of γ-butylolactone, and 50 g of N-methyl-pyrolidone were charged into a flask equipped with a stirrer, a reflux condenser, an inlet for inert gas, and a thermometer. Into this flask were additionally charged 37.9 g of the obtained polytetramethylene-glycol compound having two ends terminated by carboxylic acid, 10.9 g of adipic acid and 10.9 g of sebacic acid selected as aliphatic acids, 18.0 g of isophthalic acid selected as an aromatic carboxylic acid, and 25.5 g of 4,4'-diphenylmethane-di-isocyanate (MDI) and 17.7 g of tolylene-di-isocyanate (TDI) selected as di-isocyanates. The mixture was raised in temperature to 200° C., and, after 4 hours of reaction, was cooled to obtain polyamide resin having a resin content of 40 weight %, and an acid value of 54.8. 48.4 g of ESB400 (tradename: diglycidyl-etherified tetrabromo-bisphenol A epoxy resin marketed by Sumitomo Kagaku Kogyo KK) was additionally charged into the flask, and, after 3 hours of reaction at 150° C., dimethyl-formamide was added thereto so as to achieve a solid content of 35 weight %. This yielded denatured polyamide having an epoxy equivalent weight of 9,700.

II) Halogenated Epoxy Resin Denatured Polyamide Having a Polycarbonate-diol Residue 1,000 g of polycarbonate-diol (marketed by Daicel Kagaku Kogyo KK under the tradename of Plakcell CD210, average molecular weight 1,000), and 405 g of sebacic acid were charged into a flask equipped with a stirrer, a reflux condenser, an inlet for inert gas, and a thermometer. The mixture was raised in temperature to 200° C. over two hours, and, after 3 hours of reaction, was cooled to obtain a polycarbonate-diol compound having two ends terminated by carboxylic acid having an acid value of 82.5 and a molecular weight of 1,360. 100 g of γ-butylolactone, and 50 g of N-methyl-pyrolidone were charged into a flask equipped with a stirrer, a reflux condenser, an inlet for inert gas, and a thermometer. Into this flask were additionally charged 57.7 g of the obtained polycarbonate-diol compound having two ends terminated by carboxylic acid, 4.9 g of adipic acid and 6.8 g of sebacic acid selected as aliphatic acids, 11.2 g of isophthalic acid selected as an aromatic carboxylic acid, and 22.1 g of 4,4'-diphenylmethane-di-isocyanate (MDI) and 10.3 g of tolylene-di-isocyanate (TDI)

selected as di-isocyanates. The mixture was raised in temperature to 200° C., and, after 4 hours of reaction, was cooled to obtain polyamide resin having an acid value of 40.2. 16.2 g of ESB400 (tradename: diglycidyl-etherified tetrabromo-bisphenol A epoxy resin marketed by Sumitomo Kagaku Kogyo KK) was additionally charged into the flask, and, after 3 hours of reaction at 150° C., dimethylformamide was added thereto so as to achieve a solid content of 35 weight %. This yielded denatured polyamide having an epoxy equivalent weight of 12,400.

(Embodiment #D-1)

100 weight parts of bromurated high polymer epoxy resin having a weight averaged molecular weight of 155,000 selected as a halogenated high polymer epoxy resin and synthesized as described above, 50 weight parts of halogenated epoxy resin denatured polyamide having a polytetramethylene-glycol residue which was selected as a halogenated epoxy resin denature polyamide, 30 weight parts of bisphenol A epoxy resin (epoxy equivalent weight, 172 g/equivalent) selected as a polyfunctional epoxy resin, and 10 weight parts of isophorone-di-isocyanate which is blocked by phenol novolac were dissolved in an organic solvent containing dimethyl-acetoamide, and a bonding film varnish having a solid concentration of 40 weight % was obtained. The bonding film varnish was applied over polyethylene-phthalate film having a thickness of 50 μm and serving as carrier film so that the dry thickness of the bonding film may be 50 μm. The assembly was dried for two minutes at 100° C. and for two minutes at 150° C., and the carrier film was peeled off to obtain bonding film in semi-cured state. The heat resistance and bonding property of the bonding film was evaluated in terms of the heat resistance of a laminated board against soldering heat and the force required to peel off the copper foil (according to JIS C6481). The semi-cured bonding film was placed between 18 μm thick copper foil and a glass reinforced epoxy resin board laminated with copper foil to which an inner layer bonding process (oxidization and reduction process) was applied, and the assembly was pressed and heated for 60 minutes under the condition of 170° C. and 40 kg/cm². The obtained laminated board was subjected to the heat resistance (float) and copper peeling strength tests. The sample did not demonstrate any bloating when exposed to soldering heat of 260° C. for 180 seconds, and the force required to peel off the 18 μm thick copper foil was 1.5 kN/m. When cured bonding film obtained by heating the semi-cured bonding film at 170° C. for 30 minutes was subjected to the tensile test at the tensioning speed of 50 mm/minute, the elongation was 30%. When the bonding film was subjected to the repeated bending test according to JIS C-5016 under the condition of the bending radius of curvature of 0.38 mm and the load of 500 g, the cured bonding film ruptured after 300 cycles of bending. The cured bonding film was further subjected to a combustion test according to the UL-94VTM method as an evaluation test for the flame retardancy of the bonding film, and the obtained average combustion time was 3 seconds.

(Embodiment #D-2)

Semi-cured bonding film was obtained substantially identically as Embodiment #D-1 except for that the halogenated epoxy resin denature polyamide was used by 100 weight parts instead of 50 weight parts. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #D-1. The sample did not demonstrate any bloating when exposed to soldering heat of 260° C. for 180 seconds, and the force required to peel off the 18 μm thick copper foil was 1.7 kN/m. When the cured bonding film obtained by heating semi-cured bonding film at 170° C. for 30 minutes was subjected to the tensile test at the tensioning speed of 50 mm/minute, the elongation was 100%. When the bonding film was subjected to the repeated bending test according to JIS C-5016 under the condition of the bending radius of curvature of 0.38 mm and the load of 500 g, the cured bonding film ruptured after 800 cycles of bending. The cured bonding film was further subjected to a combustion test according to the UL-94VTM method as an evaluation test for the flame retardancy of the bonding film, and the obtained average combustion time was 2 seconds.

(Embodiment #D-3)

Semi-cured bonding film was obtained substantially identically as Embodiment #D-1 except for that creosol novolac epoxy resin (epoxy equivalent weight 195) was used instead of bisphenol A epoxy resin of Embodiment #D-1. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #D-1. The sample did not demonstrate any bloating when exposed to soldering heat of 260° C. for 180 seconds, and the force required to peel off the 18 μm thick copper foil was 1.5 kN/m. When the cured bonding film obtained by heating semi-cured bonding film at 170° C. for 30 minutes was subjected to the tensile test at the tensioning speed of 50 mm/minute, the elongation was 30%. When the bonding film was subjected to the repeated bending test according to JIS C-5016 under the condition of the bending radius of curvature of 0.38 mm and the load of 500 g, the cured bonding film ruptured after 300 cycles of bending. The cured bonding film was further subjected to a combustion test according to the UL-94VTM method as an evaluation test for the flame retardancy of the bonding film, and the obtained average combustion time was 3 seconds.

(Embodiment #D-4)

Semi-cured bonding film was obtained substantially identically as Embodiment #D-1 except for that halogenated epoxy resin denatured polyamide having a polycarbonate-diol residue was used instead of the halogenated epoxy resin denatured polyamide having polytetramethylene-glycol residue selected as a halogenated epoxy resin denatured polyamide. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #D-1. The sample did not demonstrate any bloating when exposed to soldering heat of 260° C. for 180 seconds, and the force required to peel off the 18 μm thick copper foil was 1.6 kN/m. When the cured bonding film obtained by heating semi-cured bonding film at 170° C. for 30 minutes was subjected to the tensile test at the tensioning speed of 50 mm/minute, the elongation was 26%. When the bonding film was subjected to the repeated bending test according to JIS C-5016 under the condition of the bending radius of curvature of 0.38 mm and the load of 500 g, the cured bonding film ruptured after 280 cycles of bending. The cured bonding film was further subjected to a combustion test according to the UL-94VTM method as an evaluation test for the flame retardancy of the bonding film, and the obtained average combustion time was 3 seconds.
(Comparative Example #D-1)

Semi-cured bonding film was obtained substantially identically as Embodiment #D-1 except for that the halogenated epoxy resin denatured polyamide resin of Embodiment #D-1 was omitted. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #D-1. The sample did not demonstrate any bloating when exposed to soldering heat of 260° C. for 180 seconds, and the force required to peel off the 18 μm thick copper foil was 1.6 kN/m. When the cured bonding film obtained by heating semi-cured bonding film at 170° C. for 30 minutes was subjected to the tensile test at the tensioning speed of 50 mm/minute, the elongation was 5%. When the bonding film was subjected to the repeated bending test according to JIS C-5016 under the condition of the bending radius of curvature of 0.38 mm and the load of 500 g, the cured bonding film ruptured after 50 cycles of bending. The cured bonding film was further subjected to a combustion test according to the UL-94VTM method as an evaluation test for the flame retardancy of the bonding film, and the obtained average combustion time was 2 seconds.
(Comparative Example #D-2)

Semi-cured bonding film was obtained substantially identically as Embodiment #D-1 except for that 50 weight parts of acrylic rubber including an epoxy group (marketed by Teikoku Kagaku KK under the tradename of HTR860P-3) was used instead of the halogenated epoxy resin denatured polyamide resin of Embodiment #D-1. To obtain a laminated board, the semi-cured bonding film was placed between 18 μm thick copper foil and a glass reinforced epoxy resin board laminated with copper foil to which an inner layer bonding process was applied, and the assembly was pressed and heated for 60 minutes under the condition of 170° C. and 40 kg/cm². The obtained laminated board was tested in the same way as Embodiment #D-1. The sample did not demonstrate any bloating when exposed to soldering heat of 260° C. for 180 seconds, and the force required to peel off the 18 μm thick copper foil was 1.4 kN/m. When the cured bonding film obtained by heating semi-cured bonding film at 170° C. for 30 minutes was subjected to the tensile test at the tensioning speed of 50 mm/minute, the elongation was 5%. When the bonding film was subjected to the repeated bending test according to JIS C-5016 under the condition of the bending radius of curvature of 0.38 mm and the load of 500 g, the cured bonding film ruptured after 50 cycles of bending. The cured bonding film was further subjected to a combustion test according to the UL-94VTM method as an evaluation test for the flame retardancy of the bonding film, and the obtained average combustion time was 6 seconds.

The properties of Embodiments #D-1 to #D-4 and Comparative Examples #D-1 and #D-2 are summarized in Table 4.

TABLE 4

| items | Embodiments | | | | Comparative Examples | |
| --- | --- | --- | --- | --- | --- | --- |
| | #A-1 | #A-2 | #A-3 | #A-4 | #A-1 | #A-2 |
| bromurated high polymer epoxy resin | 100 | 100 | 100 | 100 | 100 | 100 |
| bromurated epoxy resin denatured polyamide | 50 | 100 | 0 | (50) | 0 | 0 |
| acrylic rubber | 0 | 0 | 0 | 0 | 0 | 50 |
| bisphenol A epoxy resin | 30 | 30 | 0 | 30 | 30 | 30 |
| creosol novolac epoxy resin | 0 | 0 | 30 | 0 | 0 | 0 |
| blocked isocyanate | 10 | 10 | 10 | 10 | 10 | 10 |
| 260° C. soldering heat resistance (180 seconds) | not affected | not affected | not affected | not affected | not affected | not affected |
| copper foil peeling strength (kN/m) | 1.5 | 1.7 | 1.5 | 1.6 | 1.6 | 1.4 |
| elongation (%) | 30 | 100 | 30 | 26 | 5 | 5 |
| repeated bending strength (cycles) | 300 | 800 | 300 | 280 | 50 | 50 |
| average combustion time (seconds) | 3 | 2 | 3 | 3 | 2 | 6 |

Although the present invention has been described in terms of preferred embodiments thereof, it is obvious to a person skilled in the art that various alterations and modifications are possible without departing from the scope of the present invention which is set forth in the appended claims.

What we claim is:

1. Bonding film for printed circuit boards, comprising:
   (i) high polymer epoxy resin;
   (ii) denatured polyamide obtained by reacting epoxy resin and polyamide;
   (iii) polyfunctional epoxy resin; and
   (iv) curing agent.

2. Bonding film for printed circuit boards according to claim 1, wherein said denatured polyamide includes a polyalkylene-glycol residue or a polycarbonate-diol residue.

3. Bonding film for printed circuit boards according to claim 1, wherein said high polymer epoxy resin is produced by the polymerization of bifunctional epoxy resin and bifunctional phenol resin, and has a weight averaged molecular weight equal to 50,000 or higher.

4. Bonding film for printed circuit boards, comprising:
   (i) high polymer epoxy resin;
   (ii) polyamide resin having a polyalkylene-glycol residue; and (iii) polyfunctional epoxy resin.

5. Bonding film for printed circuit boards according to claim 4, wherein said high polymer epoxy resin is produced by the polymerization of bifunctional epoxy resin and bifunctional phenol resin, and has a weight averaged molecular weight equal to 50,000 or higher.

6. Bonding film for printed circuit boards according to claim 4, wherein said polyalkylene-glycol residue consists of a polytetramethylene-ether-glycol residue.

7. Bonding film for printed circuit boards, comprising:
   (i) high polymer epoxy resin;
   (ii) solvent soluble polyamide resin; and
   (iii) polyfunctional epoxy resin.

8. Bonding film for printed circuit boards according to claim 7, wherein said polyamide resin is soluble in at least one of a member selected from amide solvents, ketone solvents and lactone solvents.

9. Bonding film for printed circuit boards according to claim 7, wherein said polyamide resin comprises an aromatic residue.

10. Bonding film for printed circuit boards, comprising:
    (i) halogenated high polymer epoxy resin;
    (ii) halogenated epoxy resin denatured polyamide;
    (iii) polyfunctional epoxy resin; and
    (iv) curing agent.

11. Bonding film for printed circuit boards according to claim 10, wherein said halogenated epoxy resin denatured polyamide includes a polyalkylene-glycol residue or a polycarbonate-diol residue.

12. Bonding film for printed circuit boards according to claim 1, wherein said halogenated high polymer epoxy resin is produced by the polymerization of bifunctional epoxy resin and bifunctional phenol resin, and has a weight averaged molecular weight equal to 50,000 or higher.

* * * * *